United States Patent
Ono et al.

[11] Patent Number: 5,196,034
[45] Date of Patent: Mar. 23, 1993

[54] SEMICONDUCTOR WAFER CLEANING APPARATUS

[75] Inventors: Toshiki Ono; Shiro Yamasaki, both of Itami; Toshihiko Noguchi, Fukuoka, all of Japan

[73] Assignee: Mitsubishi Denki Kabushiki Kaisha, Tokyo, Japan

[21] Appl. No.: 737,666

[22] Filed: Jul. 30, 1991

[30] Foreign Application Priority Data

Jul. 31, 1990 [JP] Japan .................. 2-201407

[51] Int. Cl.⁵ .............................. B24C 3/32
[52] U.S. Cl. .................. 29/25.01; 51/413; 51/424; 51/436
[58] Field of Search ........... 437/225, 228, 229, 946, 437/10; 134/2, 25.4, 31, 38, 902; 29/25.01; 51/413, 436, 424, 425

[56] References Cited

U.S. PATENT DOCUMENTS

| | | | |
|---|---|---|---|
| 4,820,650 | 4/1989 | Nagae et al. | 437/10 |
| 4,932,168 | 6/1990 | Tada et al. | 51/436 |
| 4,974,375 | 12/1990 | Tada et al. | 51/413 |
| 5,025,597 | 6/1991 | Tada et al. | 51/436 |
| 5,035,750 | 7/1991 | Tada et al. | 437/10 |
| 5,081,068 | 1/1992 | Endo et al. | 437/946 |
| 5,129,198 | 7/1992 | Kanno et al. | 51/410 |

FOREIGN PATENT DOCUMENTS

| | | | |
|---|---|---|---|
| 63-86438 | 4/1988 | Japan | 437/10 |
| 3-8327 | 1/1991 | Japan | 134/902 |
| 3-167826 | 7/1991 | Japan | 134/902 |

Primary Examiner—Olik Chaudhuri
Assistant Examiner—Ourmazd S. Ojan
Attorney, Agent, or Firm—Leydig, Voit & Mayer

[57] ABSTRACT

A semiconductor wafer cleaning apparatus provided with an ice making unit and a jet nozzle for ejecting fine ice particles against a wafer held within a cleaning vessel includes an exhaust chamber having an expanded portion and connected to the cleaning vessel. Curved guide plates extend from cleaning vessel into the exhaust chamber equidistant from each other into the expanded portion to guide the jet particles into the expanded portion. A flow regulator plate having a multitude of inverted frustum-shaped tapered holes regulates the jetted particles within the cleaning bath in accordance with the downward flow direction. Further, the upward flow from the exhaust chamber along the side walls is caught by stopper plates and exhausted via exhaust ports.

5 Claims, 2 Drawing Sheets

SEMICONDUCTOR WAFER CLEANING APPARATUS

BACKGROUND OF THE INVENTION

This invention relates to cleaning apparatus for cleaning pieces of solid materials such as glass substrates and disk substrates, and more particularly to semiconductor wafer cleaning apparatus.

FIG. 3 shows a vertical section of a conventional semiconductor wafer cleaning apparatus. An ice making unit 1 surrounded by insulating materials is supplied with liquid nitrogen via a liquid nitrogen supply pipe 2. Thus, the interior of the ice making unit 1 is cooled by the evaporation of the liquid nitrogen. After the interior of the ice making unit 1 is cooled sufficiently, ultrapure water is sprayed in fine particles from a spray nozzle 3, such that fine ice particles 4 are produced. The fine ice particles 4 thus produced in the ice making unit 1 are ejected into a cleaning vessel 10 via a jet nozzle 5. The fine ice particles 4 are sprayed under high pressure by means of the ejector method utilizing a jet of a pressurized gas. Thus, by blowing the fine ice particles 4 against the wafer 7 supported by a wafer holder arm 6, the surface of the wafer 7 is cleaned. At the same time, the interior of the cleaning vessel 10 is exhausted via an exhaust blower 9 to prevent the upward flows within the cleaning vessel 10.

The above conventional semiconductor wafer cleaning apparatus, however, has the following disadvantage.

Since all the jetted particles within the cleaning vessel 10 must be drawn into the exhaust duct, a large capacity exhaust blower 9 is required. Thus, the exhaust blower 9 becomes large-sized. On the other hand, if an exhaust blower of small capacity is utilized, it is incapable of complete exhaustion of the jetted particles from the cleaning vessel 10, such that the fine ice particles 4 ejected from the jet nozzle 5 are blown upward together with the dusts to be adhered again to the wafer 7.

SUMMARY OF THE INVENTION

It is therefore an object of this invention to provide a semiconductor wafer cleaning apparatus which, although utilizing an exhaust blower of small capacity, prevents the jetted particles from blowing upward during the ejection of the fine ice particles and thereby preventing dust from adhering again to the semiconductor wafer.

The above object is accomplished in accordance with the principle of this invention by a semiconductor wafer cleaning apparatus which comprises: a cleaning vessel; holding means for holding a semiconductor wafer within the cleaning vessel ice making means for making fine ice particles of ultrapure water; jet means for ejecting said fine ice particles via a gas under high pressure against the semiconductor wafer held within said cleaning vessel by the holding means; an exhaust chamber having an expanded portion with a larger cross-section than said cleaning vessel and connected to a downstream end of said cleaning vessel; Guide plates extending from bottom portion of the cleaning vessel into the exhaust chamber for guiding a flow of said fine ice particles from the cleaning vessel into the expanded portion; and an exhaust blower for exhausting the interior of said exhaust chamber.

Preferably the semiconductor wafer cleaning apparatus comprises: a stopper plate projecting inward from a side wall of the cleaning vessel at a downstream portion of the cleaning vessel to prevent an upward flow of jetted particles from reaching the wafer; and an exhaust port formed in the side wall of the cleaning vessel at the downstream side of the stopper plate. Further it is preferred that the semiconductor wafer cleaning apparatus comprises a flow regulator plate traversing the interior of said cleaning vessel at a downstream end of the cleaning bath to regulate a flow of jetted particles within the cleaning vessel. The flow regulator plate is preferred to have a multitude of tapered holes having inverted truncated conical sections.

BRIEF DESCRIPTION OF THE DRAWINGS

The structure and method of operation of this invention will be best understood from the following detailed description, taken in conjunction with the accompanying drawings, in which.

In the drawing, like reference numerals represent like or corresponding parts or portions.

DETAILED DESCRIPTION OF THE PREFERRED EMBODIMENT

Referring now to the accompanying drawings, the preferred embodiment of this invention is described.

Figure 1:
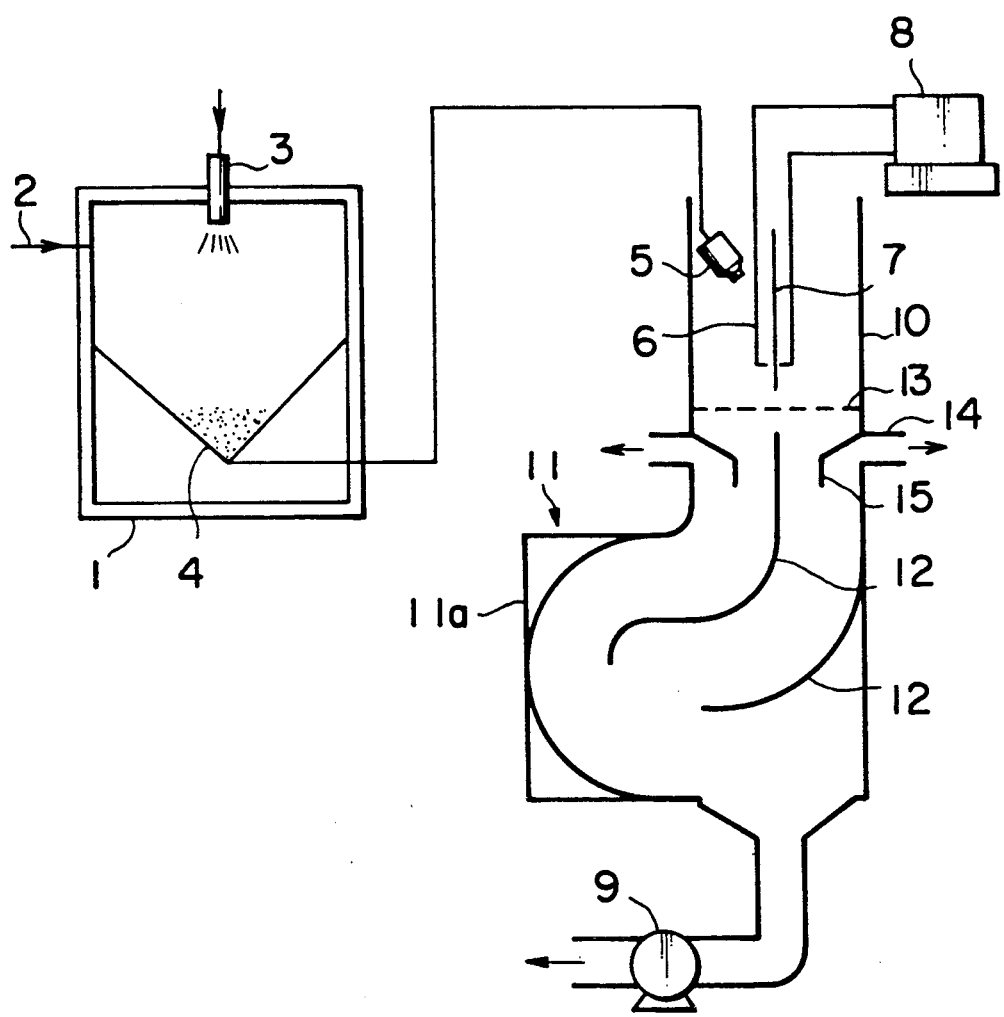
FIG. 1 shows schematically a vertical section of a semiconductor wafer cleaning apparatus according to an embodiment of this invention.

FIG. 1 shows schematically a vertical section of a semiconductor wafer cleaning apparatus according to an embodiment of this invention. The parts designated by reference numerals 1 through 10 are similar to those of the conventional semiconductor wafer cleaning apparatus of FIG. 3. Thus, an ice making unit 1 surrounded by insulating materials is supplied with liquid nitrogen via a liquid nitrogen supply pipe 2. The interior of the ice making unit 1 is cooled by the evaporation of the liquid nitrogen. After the interior of the ice making unit 1 is cooled sufficiently, ultrapure water is sprayed in fine particles from a spray nozzle 3, such that fine ice particles 4 are produced. The fine ice particles 4 thus produced in the ice making unit 1 are ejected into a cleaning vessel 10 via a jet nozzle 5. The fine ice particles 4 are sprayed under high pressure by means of the ejector method utilizing a jet of a pressurized gas. Thus, by blowing the fine ice particles 4 against the wafer 7 supported by a wafer holder arm 6, the surface of the wafer 7 is cleaned. At the same time, the interior of the cleaning vessel 10 is exhausted via an exhaust blower 9 to prevent the upward flows of jetted particles within the cleaning vessel 10. The cleaning vessel 10 has a rectangular cross-section having sides perpendicular to the sheet of the drawing that are longer than the sides parallel to the sheet. On the other hand, the translation mechanism 8 moves the wafer 7 both horizontally and vertically, such that the whole surface of the wafer 7 may be completely cleaned by the fine ice particles.

An exhaust chamber 11 having an expanded cross-section decelerates the velocity of the jetted fine ice particles. The expanded portion 11a having a large rectangular cross-section is expanded horizontally toward the side to which the jet nozzle 5 is disposed with respect to the wafer 7. The exhaust chamber 11 is connected to the bottom of the cleaning vessel 10 curved, and guide plates 12 extend from the bottom of the cleaning vessel 10 into the exhaust chamber 11 and are equidistant from each other at the expanded portion 11a to guide the jetted fine ice particles into the expanded portion 11a.

Figure 2:
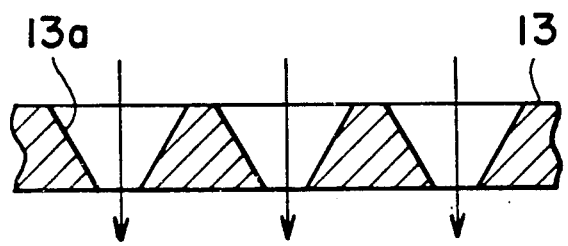
FIG. 2 is a partial sectional view of the flow regulator plate of the semiconductor wafer cleaning apparatus of FIG. 1.

Further, a flow regulator plate 13 is disposed at the bottom of the cleaning vessel 10 traversing the interior thereof. As shown in FIG. 2, the flow regulator plate 13 includes a multitude of tapered holes 13a. The sections of the tapered holes 13a are tapered downward, such that they have form of inverted truncated cones. The flow regulator plate 13 regulates the direction of the flow of the jetted particles within the cleaning vessel 10 in accordance with the main downward flow of the jetted particles, as indicated by arrows in FIG. 2.

Exhaust ports 14 are formed in side walls of the cleaning vessel 10 below stopper plates 15 projecting inward from side walls of the cleaning vessel 10 just below the flow regulator plate 13. As shown in FIG. 1, the stopper plates 15 are slanted downward from the side walls toward the center. The stopper plates 15 prevent the upward flow of jetted particles from reaching the wafer 7.

Figure 3:
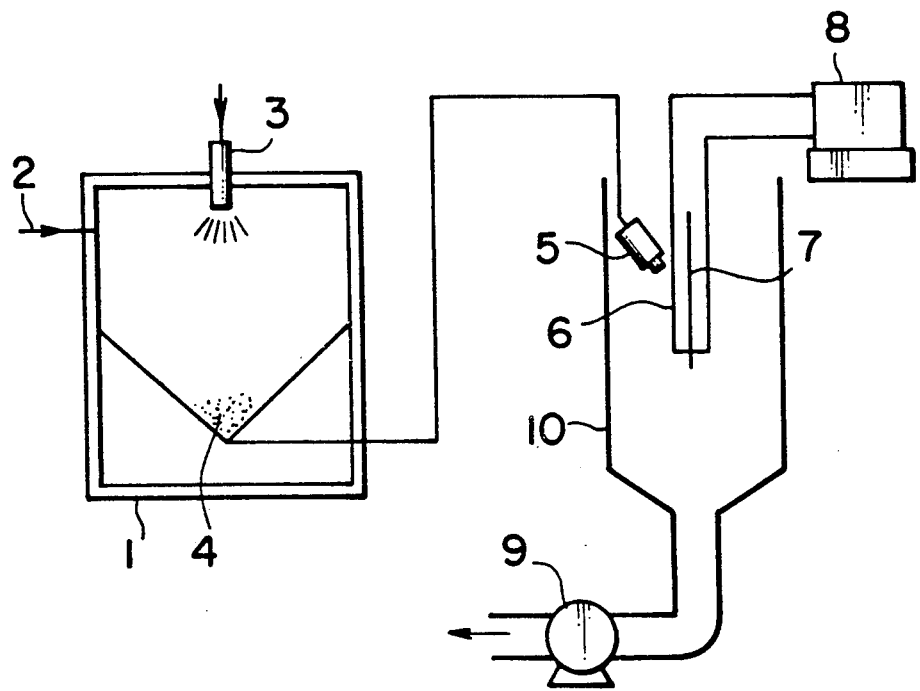
FIG. 3 shows a vertical section of a conventional semiconductor wafer cleaning apparatus.

The operation of the semiconductor wafer cleaning apparatus of FIG. 1 is fundamentally similar to that of the apparatus of FIG. 3, except that the jetted particles within the cleaning vessel 10 are exhausted by the exhaust blower 9 via the exhaust chamber 11. In the case of the semiconductor wafer cleaning apparatus of FIG. 1, the exhaust chamber 11, the guide plates 12, and the flow regulator plate 13 effectively prevent the jetted particles flowing upward from the exhaust chamber 11 to the exnaust chamber 11 from reaching the wafer 7.

Namely, the fine ice particles ejected from the jet nozzle 5 together with a gas under a high pressure passes through the flow regulator plate 13 and then are guided via the guide plates 12 into the exhaust chamber 11 having the expanded portion 11a, where the velocity of the jetted particles is effectively decelerated such that an upward flow is prevented. Further, the flow within the cleaning vessel 10 is regulated in accordance with the downward flow by means of the flow regulator plate 13. Thus, the jetted particles are rapidly decelerated and regulated into a smooth downward flow. As a result, the upward flow of the jetted particles are effectively prevented by an exhaust blower 9 of relatively small capacity. Furthermore, upward flows of the jetted particles along the inner side walls of the cleaning vessel 10 which may be generated in spite of the exhaust chamber 11 and the flow regulator plate 13 are caught by the stopper plates 15 for being exhausted via the exhaust ports 14 formed in the side walls below the exhaust chamber 11 at the root thereof. Thus, the upward flow of the jetted particles within the exhaust chamber 11 does not reach the wafer 7.

What is claimed is:

1. A semiconductor wafer cleaning apparatus comprising:
    a cleaning vessel having a cross-sectional area;
    holding means for holding a semiconductor wafer within the cleaning vessel;
    ice making means for making fine ice particles;
    jet means for ejecting said fine ice particles via a gas under high pressure against a semiconductor wafer held within said cleaning vessel by the holding means;
    an exhaust chamber having an expanded portion including a larger cross-sectional area than the cross-sectional area of said cleaning vessel and connected to said cleaning vessel;
    guide plates extending from the cleaning vessel into the exhaust chamber to guide a flow of fine ice particles from the cleaning vessel into the expanded portion; and
    an exhaust blower for exhausting said exhaust chamber.

2. A semiconductor wafer cleaning apparatus as claimed in claim 1 comprising a stopper plate projecting into the cleaning vessel for preventing an upward flow of jetted particles from reaching the wafer.

3. A semiconductor wafer cleaning apparatus as claimed in claim 2 comprising an exhaust port in the cleaning vessel at the stopper plate.

4. A semiconductor wafer cleaning apparatus a claimed in claim 1 including a flow regulator plate disposed in said cleaning vessel for regulating flow of jetted particles within the cleaning vessel.

5. A semiconductor wafer cleaning apparatus as claimed in claim 4 wherein said regulator plate includes a plurality of tapered holes having truncated conical surfaces.

* * * * *